United States Patent
Raymond

(10) Patent No.: US 12,039,465 B2
(45) Date of Patent: Jul. 16, 2024

(54) SYSTEMS AND METHODS FOR MODELING NOISE SEQUENCES AND CALIBRATING QUANTUM PROCESSORS

(71) Applicant: D-WAVE SYSTEMS INC., Burnaby (CA)

(72) Inventor: Jack R. Raymond, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 1094 days.

(21) Appl. No.: 16/878,364

(22) Filed: May 19, 2020

(65) Prior Publication Data

US 2020/0380396 A1 Dec. 3, 2020

Related U.S. Application Data

(60) Provisional application No. 62/855,512, filed on May 31, 2019.

(51) Int. Cl.
  *G06N 7/01*     (2023.01)
  *G01R 29/26*    (2006.01)
  (Continued)

(52) U.S. Cl.
  CPC ........... *G06N 7/01* (2023.01); *G01R 29/26* (2013.01); *G01R 33/24* (2013.01); *G06N 10/00* (2019.01); *B82Y 35/00* (2013.01)

(58) Field of Classification Search
  CPC ................................ G06N 10/00; G06N 7/01
  See application file for complete search history.

(56) References Cited

U.S. PATENT DOCUMENTS

6,373,294 B1  4/2002  Bentley
6,911,664 B2  6/2005  Il et al.
(Continued)

FOREIGN PATENT DOCUMENTS

KR   101446943 B1   10/2014
WO   2005093649 A1  10/2005
(Continued)

OTHER PUBLICATIONS

Danilin, "Quantum-enhanced magnetometry by phase estimation algorithms with a single artificial atom", 2018 (Year: 2018).*

(Continued)

*Primary Examiner* — Van C Mang
(74) *Attorney, Agent, or Firm* — Cozen O'Connor

(57) ABSTRACT

Calibration techniques for devices of analog processors to remove time-dependent biases are described. Devices in an analog processor exhibit a noise spectrum that spans a wide range of frequencies, characterized by 1/f spectrum. Offset parameters are determined assuming only a given power spectral density. The algorithm determines a model for a measurable quantity of a device in an analog processor associated with a noise process and an offset parameter, determines the form of the spectral density of the noise process, approximates the noise spectrum by a discrete distribution via the digital processor, constructs a probability distribution of the noise process based on the discrete distribution and evaluates the probability distribution to determine optimized parameter settings to enhance computational efficiency.

24 Claims, 4 Drawing Sheets

(51) Int. Cl.
  *G01R 33/24* (2006.01)
  *G06N 10/00* (2022.01)
  *B82Y 35/00* (2011.01)

(56) References Cited

U.S. PATENT DOCUMENTS

| | | | |
|---|---|---|---|
| 7,135,701 B2 | 11/2006 | Amin et al. |
| 7,230,266 B2 | 6/2007 | Hilton et al. |
| 7,307,275 B2 | 12/2007 | Lidar et al. |
| 7,418,283 B2 | 8/2008 | Amin |
| 7,533,068 B2 | 5/2009 | Maassen et al. |
| 7,619,437 B2 | 11/2009 | Thom et al. |
| 7,639,035 B2 | 12/2009 | Berkley |
| 7,843,209 B2 | 11/2010 | Berkley |
| 7,876,248 B2 | 1/2011 | Berkley et al. |
| 7,898,282 B2 | 3/2011 | Harris et al. |
| 7,921,072 B2 | 4/2011 | Bohannon et al. |
| 7,932,907 B2 | 4/2011 | Nachmanson et al. |
| 7,984,012 B2 | 7/2011 | Coury et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,169,231 B2 | 5/2012 | Berkley |
| 8,174,305 B2 | 5/2012 | Harris |
| 8,175,995 B2 | 5/2012 | Amin |
| 8,190,548 B2 | 5/2012 | Choi |
| 8,195,596 B2 | 6/2012 | Rose et al. |
| 8,283,943 B2 | 10/2012 | Van Den Brink et al. |
| 8,421,053 B2 | 4/2013 | Bunyk et al. |
| 8,429,108 B2 | 4/2013 | Eusterbrock |
| 8,560,282 B2 | 10/2013 | Love et al. |
| 8,854,074 B2 | 10/2014 | Berkley |
| 8,874,477 B2 | 10/2014 | Hoffberg |
| 8,972,237 B2 | 3/2015 | Wecker |
| 9,189,217 B2 | 11/2015 | Von Platen et al. |
| 9,588,940 B2 | 3/2017 | Hamze et al. |
| 9,710,758 B2 | 7/2017 | Bunyk et al. |
| 10,031,887 B2 | 7/2018 | Raymond |
| 10,650,050 B2 | 5/2020 | He et al. |
| 10,872,021 B1 | 12/2020 | Tezak et al. |
| 11,062,227 B2 | 7/2021 | Amin et al. |
| 11,087,616 B2 | 8/2021 | Rom et al. |
| 11,422,958 B2 | 8/2022 | Boothby et al. |
| 2002/0180006 A1 | 12/2002 | Franz et al. |
| 2002/0188578 A1 | 12/2002 | Amin et al. |
| 2003/0102470 A1 | 6/2003 | Il et al. |
| 2003/0169041 A1 | 9/2003 | Coury et al. |
| 2005/0008050 A1 | 1/2005 | Fischer et al. |
| 2007/0180586 A1 | 8/2007 | Amin |
| 2007/0239366 A1 | 10/2007 | Hilton et al. |
| 2008/0052055 A1 | 2/2008 | Rose et al. |
| 2009/0078931 A1 | 3/2009 | Berkley |
| 2009/0192041 A1 | 7/2009 | Johansson et al. |
| 2009/0259905 A1 | 10/2009 | Silva et al. |
| 2009/0261319 A1 | 10/2009 | Maekawa et al. |
| 2009/0289638 A1 | 11/2009 | Farinelli et al. |
| 2010/0150222 A1 | 6/2010 | Meyers et al. |
| 2011/0054876 A1 | 3/2011 | Biamonte et al. |
| 2011/0057169 A1 | 3/2011 | Harris et al. |
| 2011/0060780 A1 | 3/2011 | Berkley et al. |
| 2011/0065586 A1 | 3/2011 | Maibaum et al. |
| 2011/0138344 A1 | 6/2011 | Ahn |
| 2012/0023053 A1 | 1/2012 | Harris et al. |
| 2012/0087867 A1 | 4/2012 | Mccamey et al. |
| 2012/0144159 A1 | 6/2012 | Pesetski et al. |
| 2012/0265718 A1 | 10/2012 | Amin et al. |
| 2013/0106476 A1 | 5/2013 | Joubert et al. |
| 2013/0117200 A1 | 5/2013 | Thom |
| 2013/0267032 A1 | 10/2013 | Tsai et al. |
| 2014/0229722 A1 | 8/2014 | Harris |
| 2015/0262073 A1 | 9/2015 | Lanting |
| 2015/0286748 A1 | 10/2015 | Lilley |
| 2015/0363708 A1 | 12/2015 | Amin et al. |
| 2016/0079968 A1 | 3/2016 | Strand et al. |
| 2016/0233860 A1 | 8/2016 | Naaman |
| 2016/0238360 A1 | 8/2016 | Naud et al. |
| 2016/0267032 A1 | 9/2016 | Rigetti et al. |
| 2016/0364653 A1 | 12/2016 | Chow et al. |
| 2017/0017894 A1* | 1/2017 | Lanting ............... G06F 15/82 |
| 2017/0104695 A1 | 4/2017 | Naaman |
| 2017/0300454 A1 | 10/2017 | Maassen Van Den Brink et al. |
| 2017/0351967 A1 | 12/2017 | Babbush et al. |
| 2017/0364362 A1 | 12/2017 | Lidar et al. |
| 2018/0101786 A1 | 4/2018 | Boothby |
| 2018/0123544 A1 | 5/2018 | Abdo |
| 2019/0019098 A1 | 1/2019 | Przybysz |
| 2019/0042677 A1 | 2/2019 | Matsuura et al. |
| 2019/0042967 A1 | 2/2019 | Yoscovits et al. |
| 2019/0043919 A1 | 2/2019 | George et al. |
| 2019/0266508 A1 | 8/2019 | Bunyk et al. |
| 2019/0378874 A1 | 12/2019 | Rosenblatt et al. |
| 2019/0391093 A1 | 12/2019 | Achlioptas et al. |
| 2019/0392352 A1 | 12/2019 | Lampert et al. |
| 2020/0005155 A1 | 1/2020 | Datta et al. |
| 2020/0183768 A1 | 6/2020 | Berkley et al. |
| 2020/0334563 A1 | 10/2020 | Gambetta et al. |
| 2020/0342345 A1 | 10/2020 | Farhi et al. |
| 2020/0349326 A1 | 11/2020 | King |
| 2020/0379768 A1 | 12/2020 | Berkley et al. |
| 2020/0380396 A1 | 12/2020 | Raymond |
| 2022/0207404 A1 | 6/2022 | Boothby |

FOREIGN PATENT DOCUMENTS

| | | |
|---|---|---|
| WO | 2007085074 A1 | 8/2007 |
| WO | 2012064974 A2 | 5/2012 |
| WO | 2014123980 A1 | 8/2014 |
| WO | 2016182608 A2 | 11/2016 |
| WO | 2016183213 A1 | 11/2016 |
| WO | 2017214331 A1 | 12/2017 |
| WO | 2018064535 A1 | 4/2018 |
| WO | 2018111242 A1 | 6/2018 |
| WO | 2019005206 A1 | 1/2019 |
| WO | 2019070935 A2 | 4/2019 |
| WO | 2019168721 A1 | 9/2019 |
| WO | 2020112185 A2 | 6/2020 |
| WO | 2021011412 A1 | 1/2021 |

OTHER PUBLICATIONS

Knapp et al, "Modeling noise and error correction for Majorana-based quantum computing", 2018 (Year: 2018).*

Amin et al., "First Order Quantum Phase Transition in Adiabatic Quantum Computation", arXiv:0904.1387v3, Dec. 15, 2009, 5 pages.

Amin et al., Macroscopic Resonant Tunneling in the Presence of Low Frequency Noise, arXiv:0712.0845 [cond-mat.mes-hall], May 13, 2008, pp. 1-4.

Amin, "Effect of Local Minima on Adiabatic Quantum Optimization," Physical Review Letters 100(130503), 2008, 4 pages.

Aspuru-Guzik. "Simulated Quantum Computation of Molecular Energies", Science, Sep. 9, 2005.

Berkley, A.J. et al., "Tunneling Spectroscopy Using a Probe Qubit," arXiv:1210.6310v2 [cond-mat.supr-con], Jan. 3, 2013, 5 pages.

Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.

Byrd. "A Limited-Memory Algorithm For Bound-Contrained Optimization". SIAM Journal on Scientific Computing, Jun. 17, 2005.

Dhande et al. "End-User Calibration for Quantum Annealing". Engineering Project Report—UBC, Jan. 6, 2019.

D-Wave, "Technical Description of the D-Wave Quantum Processing Unit", D-Wave User Manual 09-1109A-M, Sep. 24, 2018, 56 pages.

Gao, Jiansong, "The Physics of Superconducting Microwave Resonators," Thesis, In Partial Fulfillment of the Requirements for the Degree of Doctor of Philosophy, California Institute of Technology Pasadena, California, May 28, 2008, 197 pages.

(56) References Cited

OTHER PUBLICATIONS

Harris et al., "Probing Noise in Flux Qubits via Macroscopic Resonant Tunneling", arXiv:0712.0838v2 [cond-mat.mes-hall], Feb. 8, 2008, pp. 1-4.
International Search Report for PCT/US2019/047747, dated Jun. 26, 2020, 4 pages.
King et al., "Observation of topological phenomena in a programmable lattice of 1,800 qubits", arXiv:1803.02047 [quant-ph], Mar. 6, 2018, 17 pages.
Lanting et al., "Geometrical dependence of the low-frequency noise in superconducting flux qubits", Physical Review B, 79, Jun. 5, 2009, Jun. 5, 2009, 4 pages.
Lanting et al., "Probing High Frequency Noise with Macroscopic Resonant Tunneling", arXiv:1103.1931v1 [cond-mat.supr-con], Mar. 20, 2011, 5 pages.
Lanting, T., "Observation of Co-tunneling in Pairs of Coupled Flux Qubits", arXiv:1006.0028v1 [cond-mat.supr-con], May 31, 2010, 4 pages.
Manucharyan et al., "Fluxonium: single Cooper pair circuit free of charge offsets", arXiv:0906.0831v2, [cond-mat.mes-hall] Oct. 20, 2009, 13 pages.
Nielsen. "The Fermionic canonical commutation relations and the Jordan-Wigner transform", School of Physical Sciences, Jul. 29, 2005.
Petersan et al., "Measurement of resonant frequency and quality factor of microwave resonators: Comparison of methods," Journal of Applied Physics, vol. 84, No. 6, Sep. 15, 1998, 11 pages.
Sete et al., "A Functional Architecture for Scalable Quantum Computing", 2016 IEEE International Conference on Rebooting Computing (ICRC), Oct. 17, 2016, 5 pages.
Swenson et al., "Operation of a titanium nitride superconducting microresonator detector in the nonlinear regime," arXiv:1305.4281v1 [cond-mat.supr-con], May 18, 2013, 11 pages.
Tolpygo et al., "Advanced Fabrication Processes for Superconducting Very Large Scale Integrated Circuits," IEEE Transactions on Applied Superconductivity 26(3):1-10, Jan. 19, 2016.
Van Harlingen et al., "Decoherence in Josephson-junction qubits due to critical current fluctuations", arXiv:cond-mat/0404307v1 [cond-mat.supr-con], Apr. 13, 2004, 24 pages.
Whittaker, J.D et al., "A Frequency and Sensitivity Tunable Microresonator Array for High-Speed Quantum Processor Readout," arXiv:1509.05811v2 [quant-ph], Apr. 22, 2016, 8 pages.
Written Opinion for PCT/US2019/047747, dated Jun. 26, 2020, 4 pages.
Yohannes et al, "Planarized, Extensible, Multilayer, Fabrication Process for Superconducting Electronics", IEEE Transactions on Applied Superconductivity, vol. 25, No. 3, Jun. 2015.
Notice of Allowance for U.S. Patent Application No. 17/272,052, dated Aug. 3, 2023, 10 pages.
Harris et al., "Experimental Demonstration of a Robust and Scalable Flux Qubit," arXiv:0909.4321v1, Sep. 24, 2009, 20 pages.
Whiticar, et al., Probing flux and charge noise with macroscopic resonant tunneling, arXiv:2210.01714v1 [quant-ph] Oct. 4, 2022. 11 pages.
Boothby, K., "Input/Output Systems and Methods for Superconducting Devices," U.S. Appl. No. 62/860,098, filed Jun. 11, 2019, 31 pages.
Boothby, K., et al., "Systems and Methods for Efficient Input and Output to Quantum Processors," U.S. Appl. No. 62/851,377, filed May 22, 2019, 40 pages.
Chen, Y. et al., "Multiplexed Dispersive Readout of Superconducting Phase Qubits," Applied Physics Letters 101 (182601), 2012, 4 pages.
Heinsoo, J. et al., "Rapid high-fidelity multiplexed readout of superconducting qubits," arXiv:1801.07904v1 [quant-ph], Jan. 24, 2018, 13 pages.
International Search Report & Written Opinion for PCT/US2020/041703 dated Oct. 27, 2020, 9 pages.
International Search Report for PCT/US2020/037222, dated Sep. 17, 2020, 3 pages.
Michotte, S., "Qubit Dispersive Readout Scheme with a Microstrip Squid Amplifier," arXiv:0812.0220v1 [cond-mat.supr-con], Dec. 1, 2008, 4 pages.
Vollmer, R., "Fast and scalable readout for fault-tolerant quantum computing with superconducting Qubits," Master's Thesis, QuTech, Department of Quantum Nanoscience, Delft University of Technology, Jul. 10, 2018, 80 pages.
Written Opinion for PCT/US2020/037222, dated Sep. 17, 2020, 5 pages.
Extended EP Search Report dated Jun. 26, 2023, EP App No. 20841331.0-11203-14 pages.
Amin, M., "Searching for Quantum Speedup in Quasistatic Quantum Annealers," arXiv:1503.04216v2 [quant-ph] Nov. 19, 2015, 5 pages.

* cited by examiner

SYSTEMS AND METHODS FOR MODELING NOISE SEQUENCES AND CALIBRATING QUANTUM PROCESSORS

FIELD

This disclosure generally relates to calibration techniques in quantum devices.

BACKGROUND

Hybrid Computing System Comprising a Quantum Processor

A hybrid computing system can include a digital computer communicatively coupled to an analog computer. In some implementations, the analog computer is a quantum computer and the digital computer is a classical computer.

The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system, respectively. In some implementations, the qubit and the coupler control systems can be used to implement quantum annealing on the analog computer.

Quantum Processor

A quantum processor may take the form of a superconducting quantum processor. A superconducting quantum processor may include a number of superconducting qubits and associated local bias devices. A superconducting quantum processor may also include coupling devices (also known as couplers) that selectively provide communicative coupling between qubits.

In one implementation, the superconducting qubit includes a superconducting loop interrupted by a Josephson junction. The ratio of the inductance of the Josephson junction to the geometric inductance of the superconducting loop can be expressed as $2\pi LI_C/\Phi_0$ (where L is the geometric inductance, $I_C$ is the critical current of the Josephson junction, and $\Phi_0$ is the flux quantum). The inductance and the critical current can be selected, adjusted, or tuned, to increase the ratio of the inductance of the Josephson junction to the geometric inductance of the superconducting loop, and to cause the qubit to be operable as a bistable device. In some implementations, the ratio of the inductance of the Josephson junction to the geometric inductance of the superconducting loop of a qubit is approximately equal to three.

In one implementation, the superconducting coupler includes a superconducting loop interrupted by a Josephson junction. The inductance and the critical current can be selected, adjusted, or tuned, to decrease the ratio of the inductance of the Josephson junction to the geometric inductance of the superconducting loop, and to cause the coupler to be operable as a monostable device. In some implementations, the ratio of the inductance of the Josephson junction to the geometric inductance of the superconducting loop of a coupler is approximately equal to, or less than, one.

Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

Markov Chain Monte Carlo

Markov Chain Monte Carlo (MCMC) is a class of computational techniques which include, for example, simulated annealing, parallel tempering, population annealing, and other techniques. A Markov chain may be used, for example when a probability distribution cannot be used. A Markov chain may be described as a sequence of discrete random variables, and/or as a random process where at each time step the state only depends on the previous state. When the chain is long enough, aggregate properties of the chain, such as the mean, can match aggregate properties of a target distribution.

The Markov chain can be obtained by proposing a new point according to a Markovian proposal process (generally referred to as an "update operation"). The new point is either accepted or rejected. If the new point is rejected, then a new proposal is made, and so on. New points that are accepted are ones that make for a probabilistic convergence to the target distribution. Convergence is guaranteed if the proposal and acceptance criteria satisfy detailed balance conditions and the proposal satisfies the ergodicity requirement. Further, the acceptance of a proposal can be done such that the Markov chain is reversible, i.e., the product of transition rates over a closed loop of states in the chain is the same in either direction. A reversible Markov chain is also referred to as having detailed balance. Typically, in many cases, the new point is local to the previous point.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

A method of operation of a hybrid processor is described. The hybrid processor comprises an analog processor and a digital processor, the digital processor has a plurality of devices, at least one of the plurality of devices has a measurable quantity associated with a noise process and an offset parameter. The method comprises:
receiving by the digital processor a model for the measurable quantity and a form of a spectral density of the noise process; approximating a noise spectrum of the noise process by a discrete distribution via the digital processor; constructing a probability distribution of the noise process based on the discrete distribution via the digital processor; and evaluating the probability distribution to determine a number of optimized parameter settings via the digital processor.

The method may further comprise applying the optimized parameter settings to one or more of the plurality of devices of the analog processor to at least partially compensate for the noise process over time. Receiving a model for the measurable quantity may comprise determining a model for the measurable quantity via the digital processor. The analog processor may comprise a quantum processor. Determining a model for the measurable quantity may comprise determining the spin state of a qubit in the quantum processor, the spins state linked to a flux noise and a flux offset parameter. Determining a model for the measurable quantity may comprise determining a magnetization of a group of qubits in the quantum processor, the magnetization linked to a flux noise and a flux offset parameter. Receiving a form of a spectral density may comprise determining a form of a spectral density of the noise process via the digital processor. Determining a form of a spectral density of the noise process may comprise at least one of: determining the measurable quantity, and computing the form of the spectral density assuming a combination of static error, a 1/f spectrum and a white noise. Constructing a probability distribution of the noise process may comprise constructing a probability distribution of the noise process on a next data point based on a probability distribution of the noise process over the frequency space and a probability distribution of the noise process over time. Constructing a probability distribution of the noise process on a next data point based on a probability distribution of the noise process over the frequency space may comprise constructing a probability distribution of the noise process on a next data point based on the probability distribution of the noise process over the frequency space derived from the spectral density of the noise process. Evaluating the probability distribution to determine optimized parameter settings may comprise evaluating the probability distribution via at least one of: a Monte Carlo method, a Markov Chain Monte Carlo method, approximate sampling, a heuristic optimization method, or optimization by the analog processor. The method may further comprise applying the optimized parameter settings to the at least one of the plurality of devices of the analog processor.

A hybrid computing system comprises: an analog processor and a digital processor, the analog processor has a plurality of devices, at least one of the plurality of devices has a measurable quantity associated with a noise process and an offset parameter. The digital processor is operable to: receive a model for a measurable quantity; receive a form of a spectral density of the noise process; approximate a noise spectrum of the noise process by a discrete distribution; construct a probability distribution of the noise process based on the discrete distribution; and evaluate the probability distribution to determine a number of optimized parameter settings. The digital processor may be operable to apply the optimized parameter settings to one or more of the plurality of devices of the analog processor to at least partially compensate for the noise process over time and or to receive a model for a measurable quantity comprises the digital processor determining the model for the measurable quantity. The analog processor may be a quantum processor. The measurable quantity may be a spin state of a qubit in the quantum processor, the spin state linked to a flux noise and a flux offset parameter. The measurable quantity may be a magnetization of a group of qubits in the quantum processor, the magnetization linked to a flux noise and a flux offset parameter. The digital processor may determine a form of a spectral density of the noise process. The form of the spectral density of the noise process may be determined by at least one of: the digital processor operable to determine the measurable quantity and the digital processor operable to compute the form of the spectral density assuming a combination of static error, 1/f spectrum and white noise. The probability distribution of the noise process may be constructed on a next data point based on a probability distribution of the noise process over the frequency space and a probability distribution of the noise process over time. The probability distribution of the noise process on a next data point may be constructed based on a probability distribution of the noise process over the frequency space derived from the spectral density of the noise process. The probability distribution to determine the optimized parameter settings may be evaluated via at least one of: Monte Carlo method, Markov Chain Monte Carlo method, a heuristic optimization method, and optimization by the analog processor. The hybrid computing system may further comprise the digital processor operable to apply the optimized parameter settings to the at least one of the plurality of devices of the analog processor.

A method of operation of a hybrid processor is described. The hybrid processor comprises a quantum processor and a digital processor. The quantum processor has a plurality of devices, at least one of the plurality of devices has a measurable quantity associated with a noise process and an offset parameter. The method comprises: receiving by the digital processor a model for the measurable quantity and a form of a spectral density of the noise process; approximating a noise spectrum of the noise process by a discrete distribution via the digital processor; constructing a probability distribution of the noise process based on the discrete distribution via the digital processor; evaluating the probability distribution to estimate a noise value via the digital processor; and setting a value of the offset parameter to the opposite of the estimated noise value via the digital processor.

Evaluating the probability distribution to estimate a noise value may comprise evaluating the probability distribution by one of: gradient descent or integration via Markov Chain Monte Carlo, to obtain a noise distribution, fitting the noise distribution to a Gaussian distribution and taking a maxima of the Gaussian distribution as the noise value. Receiving by the digital processor a model for the measurable quantity may comprise determining a model for the measurable quantity via the digital processor. The analog processor may comprise a quantum processor. Determining a model for the measurable quantity may include determining a spin state of a qubit in the quantum processor, the spin state linked to a flux noise and a flux offset parameter. Determining a model for the measurable quantity may comprise determining a magnetization of a group of qubits in the quantum processor, the magnetization linked to a flux noise and a flux offset parameter. Providing a form of a spectral density of the noise process to the digital processor comprises determining a form of a spectral density of the noise process via the digital processor. Determining a form of a spectral density of the noise process may comprise at least one of: determining the measurable quantity and computing the form of the spectral density assuming a combination of static error, 1/f spectrum and white noise. Constructing a probability distribution of the noise process may comprise constructing a probability distribution of the noise process on a next data point based on a probability distribution of the noise process over the frequency space and a probability distribution of the noise process over time. Constructing a probability distribution of the noise process on a next data point based on the probability distribution of the noise process over the frequency space may comprise constructing a probability distribution of the noise process on a next data point based on the probability distribution of the noise process over the frequency space derived from the spectral density of the noise process.

A method of operation of a hybrid processor is described. The hybrid processor comprises a quantum processor and a digital processor, the quantum processor has a plurality of devices, at least one of the plurality of devices has a measurable quantity associated with a noise process and an offset parameter. The method comprises: receiving by the digital processor a model for the measurable quantity and a form of a spectral density of the noise process; approximating a noise spectrum of the noise process by a discrete distribution via the digital processor; constructing a probability distribution of the noise process based on the discrete distribution via the digital processor; determining an iterative rule for determining a value of the offset parameter, the rule depending of an optimal calibration parameter α, via the digital processor; evaluating α via the digital processor; and setting α as the value of the offset parameter via the digital processor.

Evaluating α may comprise evaluating a as a function of the probability distribution of the noise process and the iterative rule. Providing a model for the measurable quantity to the digital processor comprises determining a model for the measurable quantity via the digital processor. The analog processor may comprise a quantum processor. Determining a model for the measurable quantity may comprise determining a spin state of a qubit in the quantum processor, the spin state linked to a flux noise and a flux offset parameter. Determining a model for the measurable quantity may comprise determining a magnetization of a group of qubits in the quantum processor, the magnetization linked to a flux noise and a flux offset parameter. Determining a model for the measurable quantity may comprise determining a magnetization of a group of qubits in the quantum processor, the magnetization linked to a flux noise and a flux offset parameter. Receiving a form of a spectral density of the noise process may comprise determining a form of a spectral density of the noise process via the digital processor. Determining a form of a spectral density of the noise process may comprise at least one of: determining the measurable quantity and computing the form of the spectral density assuming a combination of static error, a 1/f spectrum and a white noise. Constructing a probability distribution of the noise process may comprise constructing a probability distribution of the noise process on a next data point based on a probability distribution of the noise process over the frequency space and a probability distribution of the noise process over time. Constructing a probability distribution of the noise process on a next data point based on the probability distribution of the noise process over the frequency space may comprise constructing a probability distribution of the noise process on a next data point based on the probability distribution of the noise process over the frequency space derived from the spectral density of the noise process.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Figure 1:
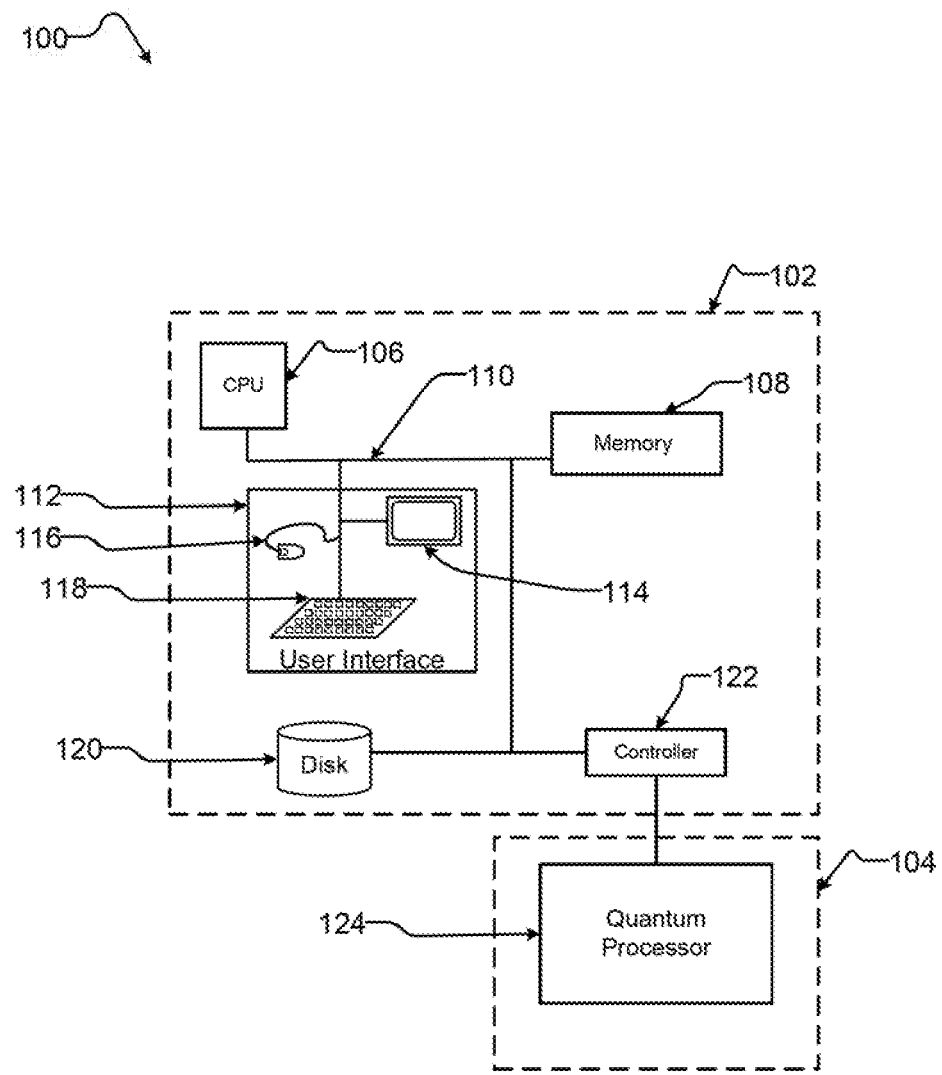
FIG. 1 is a schematic diagram of an example hybrid computing system comprising an analog processor and a digital processor.

FIG. 1 illustrates a hybrid computing system 100 including a digital computer 102 coupled to an analog computer 104. The example digital computer 102 is a classical computer 102 that includes a digital processor (CPU) 106 that may be used to perform classical digital processing tasks.

Classical computer 102 may include at least one digital processor (such as central processor unit 106 with one or more cores), at least one system memory 108, and at least one system bus 110 that couples various system components, including system memory 108 to central processor unit 106. The digital processor may be a logic processing unit, such as one or more central processing units ("CPUs"), graphics processing units ("GPUs"), digital signal processors ("DSPs"), application-specific integrated circuits ("ASICs"), programmable gate arrays ("FPGAs"), programmable logic controllers (PLCs), etc.

Classical computer 102 may include a user input/output subsystem 112. In some implementations, the user input/output subsystem includes one or more user input/output components such as a display 114, mouse 116, and/or keyboard 118.

System bus 110 can employ any known bus structures or architectures, including a memory bus with a memory controller, a peripheral bus, and a local bus. System memory 108 may include non-volatile memory, such as read-only memory ("ROM"), static random-access memory ("SRAM"), Flash NANO; and volatile memory such as random-access memory ("RAM") (not shown).

Classical computer 102 may also include other non-transitory computer or processor-readable storage media or non-volatile memory 120. Non-volatile memory 120 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 120 may communicate with the digital processor via system bus 110 and may include appropriate interfaces or controllers 122 coupled to system bus 110. Non-volatile memory 120 may serve as long-term storage for processor- or computer-readable instructions, data structures, or other data (sometimes called program modules) for classical computer 102.

Although classical computer 102 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc. Those skilled in the relevant art will appreciate that some computer architectures employ volatile memory and non-volatile memory. For example, data in volatile memory can be cached to non-volatile memory, or a solid-state disk that employs integrated circuits to provide non-volatile memory.

Various processor- or computer-readable instructions, data structures, or other data can be stored in system memory 108. For example, system memory 108 may store instruction for communicating with remote clients and scheduling use of resources including resources on the classical computer 102 and analog computer 104. For example, the system memory 108 may store processor- or computer-readable instructions, data structures, or other data which, when executed by a processor or computer causes the processor(s) or computer(s) to execute one, more or all of the acts of the methods 200, 300 and 400 of FIGS. 2, 3, and 4, respectively.

In some implementations system memory 108 may store processor- or computer-readable instructions to perform pre-processing, co-processing, and post-processing by classical computer 102. System memory 108 may store at set of quantum computer interface instructions to interact with the analog computer 104.

Analog computer 104 may take the form of a quantum computer. Quantum computer 104 may include one or more quantum processors such as quantum processor 124. The quantum computer 104 can be provided in an isolated environment, for example, in an isolated environment that shields the internal elements of the quantum computer from heat, magnetic field, and other external noise (not shown). Quantum processor 124 includes programmable elements such as qubits, couplers and other devices. In accordance with the present disclosure, a quantum processor, such as quantum processor 124, may be designed to perform quantum annealing and/or adiabatic quantum computation. Example of quantum processor are described in U.S. Pat. No. 7,533,068.

The programmable elements of quantum processor 124, such as, for example, qubits, couplers, Digital to Analog Converters (DACs), readout elements, and other devices need to be calibrated. A calibration may be performed before quantum processor 124 is operated for the first time. Additionally, it may be advantageous to perform a calibration every time there is a change in the isolated environment of quantum processor 124, for example during a regular maintenance. Calibrating the devices of a quantum processor is advantageous to obtain well balanced samples from problems, including easy problems (e.g., independent spins) and hard problems (e.g., sampling, optimization of large, frustrated problems), to be solved with the quantum processor. The quantum processor may need to be programmed with a problem to be solved, for example by a digital or classical processor, before being operated.

Calibration methods for the devices or elements comprising quantum processors have been implemented with the aim of at least reducing unwanted time-dependent biases. Elements in quantum processors are known to exhibit a respective noise spectrum that spans a wide range of frequencies, characterized by a 1/f spectrum. Therefore, samples used for statistical studies cannot be assumed to be independent, even on long time scales. Current calibration methods are only verified empirically, for example, by ad-hoc criteria, and, therefore, offer no theoretical guarantee for usefulness or correctness.

The present disclosure describes systems and methods to evaluate calibration procedures assuming only a given power spectral density and to determine parameter offsets to be used in a calibration procedure assuming only the power spectral density. The present methods may be executed by a hybrid computing system, for example hybrid computing system 100 of FIG. 1.

A statistically measurable scalar quantity m of a device of a quantum processor, associated with a known noise process $\phi$ and calibration adjustment parameter $\phi^o$, can be described via a model $P(m|\phi, \phi^o)$. An example of scalar quantity m is the spin-state of a single qubit (or magnetization of a group of qubits), which spin-state or magnetization is linked to flux noise $\phi$ and a flux offset parameter $\phi^o$. The form of the spectral density PSD ($\phi$) can be measured or computed, for example by assuming a combination of statistical error, 1/f spectrum and white noise.

The noise spectrum of the measurements can be approximated by a noise distribution over discrete frequencies, aligned with a discrete time measurement process on m. For regular data intervals, e.g., hourly calibration routines, successive reads or successive programming, the discretization of the noise spectrum can be robust. In some implementations, the discrete distribution may not be continuous, and may have missing values. These missing values may be inferred during the calibration process. The spectrum high frequency cut-off is either controlled by the read time for a single sample (e.g., O(μs)), single programming (e.g., O(ms)), or between calibration updates, which can range from minutes to hours. The low frequency cut-off can represent the time-scale on which a device in the quantum processor should be calibrated, for example the duration of an experiment or the lifetime of the device.

In one implementation, the spectral density may be determined by running the analog processor and measuring the spectral density of the analog processor and sending this spectral density data to the digital computer. The power spectral density may also be determined at the same time as the flux biases or flux offsets are determined, using the Empirical Bayes Approach.

A probability distribution over the noise process (also referred in the present disclosure as sequence), for example the noise process of a qubit's flux, can be constructed based only on the spectrum. The probability distribution may be represented or expressed as an integral. The probability distribution can be used to choose a parameter calibration adjustment on the next programming of $\phi^0$, to at least reduce errors. For example, spin states (or magnetization over a plurality of programming of the quantum processor) are expected to be zero biased (i.e., non-biased) in absence of programmed external biases. Therefore, it is desirable to choose a flux offset of a qubit on the next programming in order to minimize the expected distance between the average spin value and the known value (i.e., 0).

The integral representing the probability distribution can be evaluated, for example by Monte-Carlo or Markov Chain Monte Carlo (MCMC) methods, to determine the optimal parameter setting, therefore achieving optimal performance under well-defined theoretical assumptions that account for time dependence. In the present disclosure and appended claims, optimal parameter settings (or optimized parameter settings) are parameter settings that reduce time dependent biases in the elements of a quantum processor. Other techniques, such as approximate sampling, heuristic optimization, or optimization using a quantum processing unit (QPU) may also be used.

For simplicity, the following description will refer to calibrating the flux of a qubit in a quantum processor, and measurements of magnetization for independent spins, for example one magnetization measurement per programming of the quantum processor, with roughly evenly spaced programmings (e.g., once per hour). However, other statistics pertinent to the calibration of a quantum processor can be considered. In addition, the samples, or measurements, may not be evenly spaced.

For notational convenience, and assuming time reversal symmetry of the noise process, the systems and methods in the present disclosure will be described presuming the time running backwards. For example, systems and methods are described to predict the flux noise at time 0, given known values for the flux offset $\phi^0$ and magnetizations m for $t \in [1, T_D]$, where $T_D$ is the number of discrete data points, alongside a longer background noise process, extending to $T \gg T_D$ (e.g., a factor 10).

The relationship between the data (m) flux process noise, the sampling flux offset and the measured magnetization $m_t$ at time t is given by the thermal relation under the freeze-out hypothesis (discussed, for example, in Amin (https://arxiv.org/pdf/1503.04216.pdf%E2%80%8B)), which is well established for independent spins:

$$m_t = f(\phi_t^0, \phi_t) = \tan h(\beta^*[\phi_t^0 + \phi_t]) + n_t \quad (1)$$

Where $n_t$ is the random sampling error of measuring m well approximated by a Gaussian distribution $N(0, 1/n_s)$ independent of $\phi$, $\phi^0$ and t if enough independent samples $n_s$ are drawn or measured and $\phi_t^0 \approx \phi_t$, and $\beta$ is a freeze-out inverse temperature parameter.

Thus, the likelihood of the data given the sequences is defined as:

$$P(m_t | \phi_t^0, \phi_t) \propto \exp\left(-\frac{(m_t - f(\phi_t^0, \phi_t))^2}{[2n_s]}\right) \quad (2)$$

In the case of $\phi_t^0 \approx \phi_t$, f can be linearized, and the sampling noise $n_t$ is equivalent to additional white noise on the flux.

The systems and methods herein described can be specified by approximating the dependence of m on flux parameters $[\phi_t^0 + \phi_t]$ as linear, this being generally applicable in the limit of nearly calibrated regime where errors are small. Therefore, the present systems and methods can be applied to calibration of systems of strongly coupled variables, and are not limited to single-spin of a qubit or single-chain of qubits. Calibrating one qubit, or one logical qubit (i.e., a plurality of qubits coupled or chained together so as to behave like a single qubit), at a time for large coupled problems may be inefficient for situations where spins are coupled and something about the coupling is known. For example, if the pattern of correlations is known, patterns in the impact of the control parameters (directions of high susceptibility) can be identified, and these directions (where signal to noise ratio is higher) can be calibrated more accurately.

Relation between the discrete noise spectrum and the discretized real time noise process is given by the inverse Fourier Transform.

$$\phi_t = \sum_{\omega=-T/2}^{T/2-1} \phi_\omega \exp(i2\pi\omega t/T) \quad (3)$$

where $\phi_t$ is the signal in the time space, $\phi_\omega$ is the signal in frequency space and T is the length of sequence to be transformed. Eq. (3) defines a deterministic relationship $P(\{\phi_t\}|\{\phi_\omega\})$, but both variables $\phi_t$ and $\phi_\omega$ can be treated as random variables for simplicity. One variable type or the other, for example $\phi_t$, will be explicitly integrated out once the distribution of interest is determined.

The power distribution in frequency space $\phi_\omega$ is known, therefore, no assumptions are necessary to define a probability distribution over the frequency fluxes from the power spectral density for the non-negative frequency components $$P(\{\phi_\omega\}) \propto \prod_\omega \exp(-\phi_\omega^2 / [2PSD(\omega)]) \quad (4)$$

Where the negative components are conjugate (since the noise sequence is real):

$$\phi_\omega = \phi^*_{-\omega}.$$

Under the above assumptions, the probability distribution of the data for the next data point, or flux noise on the next data point can be represented or expressed as:

$$P(\phi_0 | \phi^0, m) = \quad (5)$$

$$\int_{t=1}^{T} d\phi_t \int_{\omega=T_D+1}^{T} [d\phi_\omega] \left\{ P(\{\phi_\omega\}) P(\{\phi_t\} | \{\phi_\omega\}) \prod_{t=1}^{T_D} P(m_t | \phi_t^0, \phi_t) \right\}$$

where $\phi_0$ is the value of $\phi_t$ at time t=0 (the next value in the noise sequence). It is possible to integrate out either $\{\phi_t\}$ or $\{\phi_\omega\}$. Depending on the spectral properties it may be advantageous to integrate out one or the other variable. An example where integration of $\phi_t$ is favorable is when only a narrow range (or sparse subset) of frequencies require modelling. In the example of 1/f noise, only the lower frequency must be modeled with high accuracy, approximating the higher frequency elements by white noise—in this case integrating out the large number of time variables leaves only a relatively small problem to solve. By contrast, if there are relative few unknown time components (e.g., $T \sim T_D$, with no data gaps) it becomes advantageous to integrate out the frequencies, leaving only the relatively small number of unknown time elements.

In addition, it is also possible to make the integral of significantly lower dimension by explicitly modelling all of the high frequency components as white noise, thus, leaving a very sparse representation for PSD($\phi$) over only the lowest frequencies.

Eq. (5) can be evaluated via Monte Carlo or Markov Chain Monte Carlo methods. However, other methods for evaluating the integral can employed, for example, maximizing the probability of the unknown parameters (i.e., working with the most likely flux sequences, instead of a distribution over flux sequences, or maximum likelihood estimators).

The systems and methods of the present disclosures can be used, for example, to estimate the ideal flux offset of a qubit. Determining correctly the flux offset will lead to reduced error on any measurements sensitive to noise on the next step, given a history of calibrations. An appropriate flux offset setting will bring magnetization close to zero, by appropriate choice of $\phi_0^0$. Since the noise distribution is expected to be Gaussian-like and the error is expected to be roughly symmetric, setting $\phi_0^0 = -\mathrm{argmax}_{\phi_0} P(\phi_0|\phi^0, m)$ will estimate an ideal flux offset. The flux offset can be estimated by integration or by approximation to the integral (e.g., maximizing with respect to the integration parameters).

Algorithm 1 (see below) contains pseudocode for estimating the ideal flux offset of a qubit.

---
Algorithm 1
---
// MAP estimator :
Inputs :
f ( ) , T , n_S {phi^0_t , m_t : t=1 , . . . , T_D } , PSD
Output :
\phi_0 : Estimate of the flux noise on the next step \\
(set \ phi^0_0 = - \ phi_0 to compensate )
Method :
gradient descent of P(\ phi_0 | \phi^0,m)) in {\phi_\omega }
or
integrate P(\phi_0 | \phi^0,m)) by MCMC: \\
fit \phi_0 distribution by a Gaussian and take maxima.
---

The systems and methods described in the present disclosure can be used, for example, for parameterizing local iterative flux estimators. The error for choosing the next flux offset $\phi_0^0$ can be calculated according to some a parameterized rule $R_\alpha(\phi^0, m)$, where $\alpha$ represents an optimal parameter for successive iteration of calibration. An example of an iterative rule to minimize the variance of magnetization is $R_\alpha(\phi^0, m)$: $\phi_{t+1}=\phi_t+\alpha m_t$. For example, the mean square error can be minimized as follows:

$$\alpha = \mathrm{argmin}_\alpha \mathrm{Error}(\alpha) - \mathrm{argmin}_\alpha \int d\phi_0 P(\phi_0|\phi^0,m) f(R_\alpha(\phi^0,m),\phi_0)^2 \quad (6)$$

Using EQ (6) may be advantageous given that a needs to be determined only once. Also, EQ (6) may be more robust to imperfections (e.g., unmodelled effects like occasional readout errors) whilst correctly identifying trends related to bulk noise properties (e.g., how to adjust α in the case of lower mid-band noise).

Since parameterizing the estimator is a one-time effort, it may be worth explicitly integrating EQ (6) via MCMC to high precision to obtain a more accurate result. Alternatively, maximizing the integration variables to evaluate EQ (6) is also possible. Algorithm 2 (see below) contains pseudocode for optimizing calibration parameters.

---
Algorithm 2
---
// Optimizing parameters of robust shim methods :
Inputs :
f( ) , R( ) , T, n_S {phi^0_t , m_t : t=1 ,..., T_D }, \alpha
Output :
\alpha : Optimal parameter for iterative shimming method \\
Method:
Solve equation (6) by integration, \\
Or optimization , of unknown noise process parameters.
---

The systems and methods described in the present disclosure can be used, for example, for determining a probability for the full unseen noise process $P(\phi|\phi^0, m)$, thus allowing extrapolation or interpolation. The distribution over any flux can be determined historically, or a subsequent distribution can be determined by marginalization or by directly sampling full sequences from the determined distribution. The probability distribution can be used to conduct statistically significant testing, or importance sampling, of historical data to better improve estimators or properly evaluate the uncertainty of the experiment, for example, by bootstrapping methods. As used herein, calibration parameter α may be a single value, a set of values, or a function of time.

Figure 2:
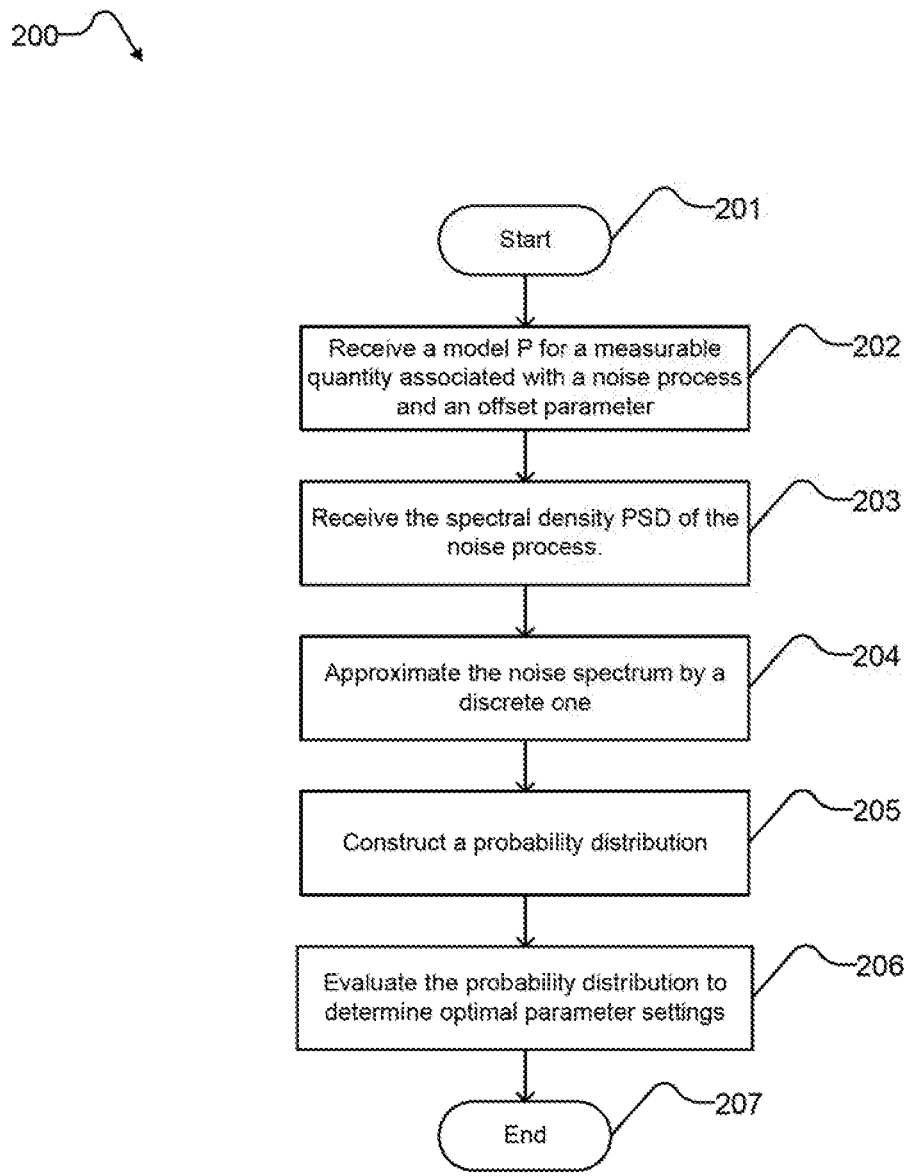
FIG. 2 is a flow diagram showing an example method for calibrating devices in a quantum processor by determining optimized optimal parameter offset.

FIG. 2 shows an example method 200 for calibrating devices in a quantum processor by determining optimal parameter offset. Method 200 may be executed on a hybrid computing system comprising an analog processor and a digital processor, for example hybrid computing system 100 having a classical and a quantum processor of FIG. 1.

Method 200 comprises acts 201 to 207; however, a person skilled in the art will understand that the number of acts is an example and, in some implementations, certain acts may be omitted, further acts may be added, and/or the order of the acts may be changed.

Method 200 starts at 201, for example in response to a call from another routine.

At 202, hybrid computing system 100 receives a model. The digital processor may determine a model $P(m_t|\phi_t^0, \phi_t)$ for a measurable quantity m associated with a noise process $\phi$ and an offset parameter $\phi^0$. An example model is given in EQ (2). Alternatively, hybrid computing system receives the model as part of a set of inputs and includes the appropriate parameter values. In one implementation, the model may be a theoretical model that is provided as an input.

At 203, hybrid computing system 100 receives a spectral density PSD($\phi$). Hybrid computing system 100 may measure m to determine PSD($\phi$) or hybrid computing system 100 may computed the form of PSD($\phi$), for example assuming a combination of statistical error, 1/f spectrum and white noise. In one implementation, the spectral density may be a theoretical spectral density that is provided as an input.

At 204, hybrid computing system 100 approximates a noise spectrum by a discrete distribution, aligned with a discrete measurement process on m. Hybrid computing system 100 determines a relationship $P(\{\phi_t\}, \{\phi_\omega\})$ between the signal in the time space $\phi_t$ and the signal in the frequency space $\phi_\omega$. The relation between the discrete noise process and the discretized real time noise process is given by the inverse Fourier transform of EQ (3). As noted above, the discrete distribution may not have continuous intervals, and missing values may be inferred.

At 205, hybrid computing system 100 constructs a probability distribution of the noise process based on the discrete distribution, as described above with reference to EQ (5). Hybrid computing system 100 uses the deterministic relationship P({$\phi_t$}, {$\phi_\omega$}) determined at 204, and the model determined at 202 to arrive at the probability distribution of EQ (5). In one implementation, the probability distribution may be a probability distribution of the noise process over time. In another implementation, the probability distribution may be a probability distribution of the noise process over a frequency space.

At 206, hybrid computing system 100 evaluates the probability distribution constructed at 205. The probability distribution may be evaluated by Monte Carlo or Markov Chain Monte Carlo methods. The probability distribution may also be evaluated by approximate sampling, a heuristic optimization method, or optimization by the analog processor.

At 207, method 200 terminates, until it is, for example, invoked again.

Figure 3:
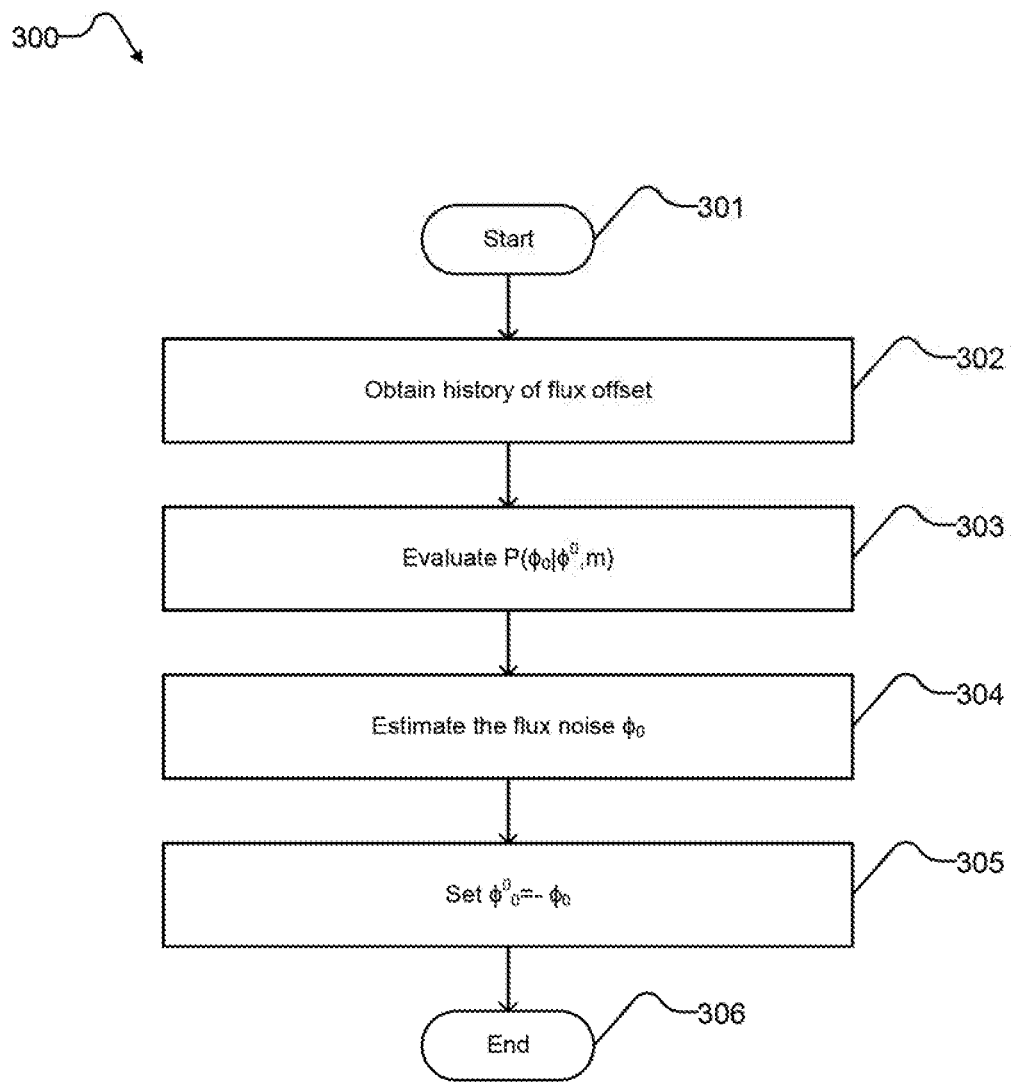
FIG. 3 is a flow diagram showing an example method to estimate flux noise in a quantum processor.

FIG. 3 shows an example method 300 to estimate flux noise in a quantum processor. Method 300 may be executed on a hybrid computing system comprising a classical and a quantum processor, for example hybrid computing system 100 of FIG. 1.

Method 300 comprises acts 301 to 306; however, a person skilled in the art will understand that the number of acts is an example and, in some implementations, certain acts may be omitted, further acts may be added, and/or the order of the acts may be changed.

Method 300 starts at 301, for example in response to a call from another routine.

At 302, hybrid computing system 100 obtains a history of a noise in a parameter measurement. In one implementation, hybrid computing 100 obtains a history of a flux noise of a qubit. For example, hybrid computing system 100 may obtain independent samples $n_s\{\phi_t^0, m_t: t=1, \ldots T_D\}$, $f(\phi_t^0, \phi_t)$, a spectral density PSD($\phi$), and a probability distribution $P(\phi_0|\phi^0, m)$, as described in method 200 of FIG. 2.

At 303, hybrid computing system 100 evaluates the probability distribution $P(\phi_0|\phi^0, m)$ from EQ (5). In one implementation, $P(\phi_0|\phi^0, m)$ is evaluated by gradient descent in {$\phi_\omega$}. Alternatively, $P(\phi_0|\phi^0, m)$ is evaluated by integration via Markov Chain Monte Carlo.

At 304, hybrid computing system 100 estimates $\phi_0$ (e.g., the flux noise on the next calibration). In one implementation, the $\phi_0$ distribution is fitted to a Gaussian distribution and the maxima taken.

At 305, hybrid computing system 100 sets the next flux offset $\phi_0^0 = -\phi_0$ to compensate the flux noise.

At 306, method 300 terminates, until it is, for example, invoked again.

Figure 4:
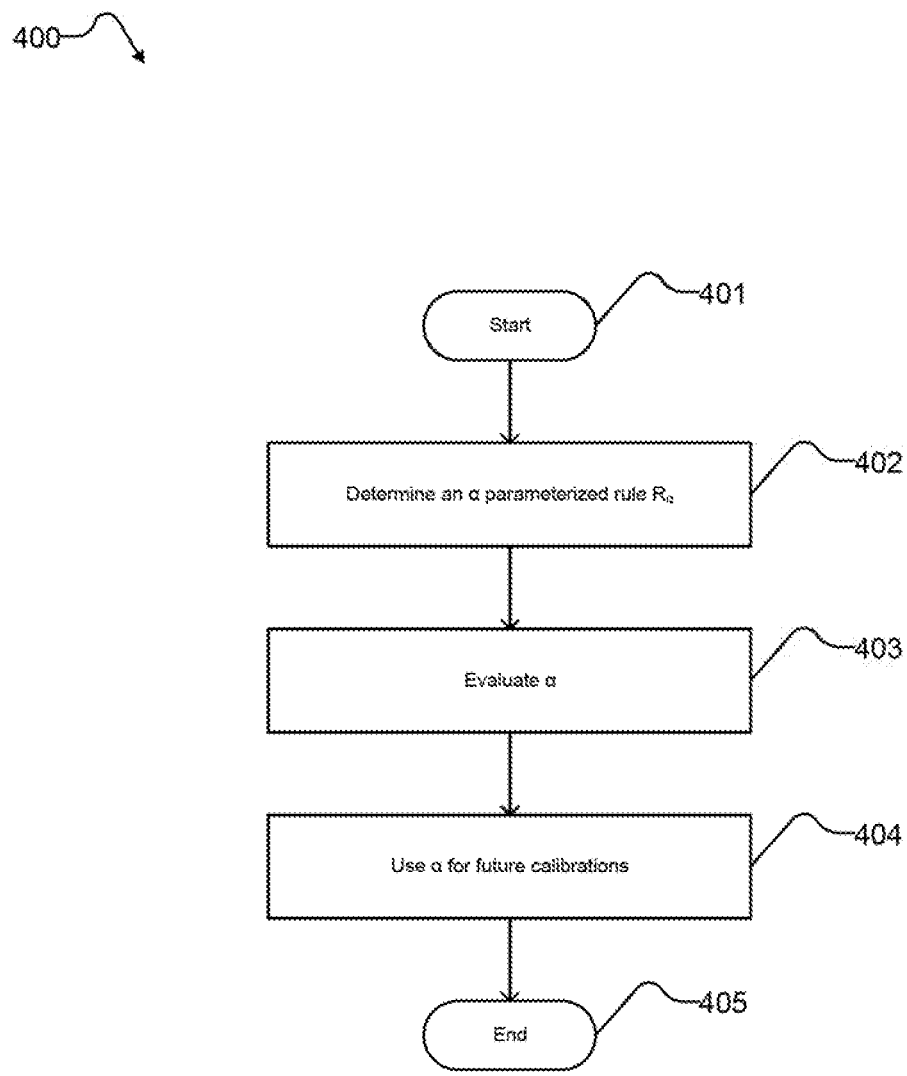
FIG. 4 is a flow diagram showing an example method for parameterizing the local iterative flux estimator in a quantum processor.

FIG. 4 shows an example method 400 for parameterizing a local iterative flux estimator in a quantum processor. Method 400 may be executed on a hybrid computing system comprising a classical and a quantum processor, for example hybrid computing system 100 of FIG. 1.

Method 400 comprises acts 401 to 405; however, a person skilled in the art will understand that the number of acts is an example and, in some implementations, certain acts may be omitted, further acts may be added, and/or the order of the acts may be changed.

Method 400 starts at 401, for example in response to a call from another routine.

At 402, hybrid computing system 100 determines an $\alpha$ parameterized rule $R_\alpha(\phi^0, m)$ to choose the next flux offset $\phi_0^0$, where $\alpha$ is defined as an optimal parameter to be used for future calibrations. In at least one implementation $R_\alpha(\phi^0, m)$: $\phi_{t+1} = \phi_t + \alpha m$.

At 403, hybrid computing system 100 evaluates $\alpha$, where $\alpha$ is defined in EQ (6). In at least one implementation, EQ (6) is solved by integration, for example via MCMC. Alternatively, the variables in EQ (6) may be maximized to evaluate $\alpha$.

At 404, hybrid computing system 100 uses $\alpha$ as a calibration adjustment parameter for future calibrations of quantum computer 102.

At 405, method 400 terminates, until it is, for example, invoked again.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Provisional Patent Application No. 62/855,512 and U.S. Pat. No. 7,533,068.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of operation of a hybrid processor, the hybrid processor comprising a quantum processor and a digital processor, the quantum processor having a plurality of devices, at least one of the plurality of devices having a measurable quantity associated with a noise process and an offset parameter, the method comprising:

receiving by the digital processor a model for the measurable quantity and a form of a spectral density of the noise process;

approximating a noise spectrum of the noise process by a discrete distribution via the digital processor;

constructing a probability distribution of the noise process based on the discrete distribution via the digital processor, wherein constructing a probability distribution of the noise process includes constructing a probability distribution of the noise process on a next data point based on a probability distribution of the noise process over the frequency space derived from the spectral density of the noise process and the probability distribution of the noise process over time;

evaluating the probability distribution to determine a number of parameter settings that reduce time dependent biases in the quantum processor via the digital processor;

applying the number of parameter settings that reduce time dependent biases in the quantum processor to one or more of the plurality of devices of the quantum processor to at least partially compensate for the noise process over time; and operating the quantum processor to solve a problem using the number of parameter settings that reduce time dependent biases in the quantum processor.

2. The method of claim 1 wherein receiving by the digital processor a model for the measurable quantity comprises determining a model for the measurable quantity via the digital processor.

3. The method of claim 2 wherein determining a model for the measurable quantity includes at least one of:
determining the spin state of a qubit in the quantum processor, the spins state linked to a flux noise and a flux offset parameter; and
determining a magnetization of a group of qubits in the quantum processor, the magnetization linked to a flux noise and a flux offset parameter.

4. The method of claim 1 wherein receiving by the digital processor a form of a spectral density of the noise process comprises determining a form of a spectral density of the noise process via the digital processor.

5. The method of claim 4 wherein determining a form of a spectral density of the noise process includes at least one of: determining the measurable quantity, and computing the form of the spectral density assuming a combination of static error, a 1/f spectrum and a white noise.

6. The method of claim 1 wherein evaluating the probability distribution to determine parameter settings that reduce time dependent biases in the quantum processor includes evaluating the probability distribution via at least one of: a Monte Carlo method, a Markov Chain Monte Carlo method, approximate sampling, a heuristic optimization method, or optimization by the quantum processor.

7. A hybrid computing system, the hybrid computing system comprising: a quantum processor and a digital processor, the quantum processor having a plurality of devices, at least one of the plurality of devices having a measurable quantity associated with a noise process and an offset parameter, the digital processor operable to:
receive a model for a measurable quantity;
receive a form of a spectral density of the noise process;
approximate a noise spectrum of the noise process by a discrete distribution;
construct a probability distribution of the noise process based on the discrete distribution on a next data point based on a probability distribution of the noise process over the frequency space derived from the spectral density of the noise process and the probability distribution of the noise process over time;

evaluate the probability distribution to determine a number of parameter settings that reduce time dependent biases in the quantum processor;

apply the parameter settings that reduce time dependent biases in the quantum processor to one or more of the plurality of devices of the quantum processor to at least partially compensate for the noise process over time; and instruct the quantum processor to operate to solve a problem using the number of parameter settings that reduce time dependent biases in the quantum processor.

8. The hybrid computing system of claim 7 wherein the digital processor being operable to receive a model for a measurable quantity comprises the digital processor determining the model for the measurable quantity.

9. The hybrid computing system of claim 8 wherein the measurable quantity is at least one of:
a spin state of a qubit in the quantum processor, the spin state linked to a flux noise and a flux offset parameter; and
a magnetization of a group of qubits in the quantum processor, the magnetization linked to a flux noise and a flux offset parameter.

10. The hybrid computing system of claim 7 wherein the digital processor being operable to receive a form of a spectral density of the noise process comprises the digital processor determining a form of a spectral density of the noise process.

11. The hybrid computing system of claim 10 wherein the form of the spectral density of the noise process is determined by at least one of: the digital processor operable to determine the measurable quantity and the digital processor operable to compute the form of the spectral density assuming a combination of static error, 1/f spectrum and white noise.

12. The hybrid computing system of claim 7 wherein the probability distribution to determine the parameter settings that reduce time dependent biases in the quantum processor is evaluated via at least one of: Monte Carlo method, Markov Chain Monte Carlo method, a heuristic optimization method, and optimization by the quantum processor.

13. A method of operation of a hybrid processor, the hybrid processor comprising a quantum processor and a digital processor, the quantum processor having a plurality of devices, at least one of the plurality of devices having a measurable quantity associated with a noise process and an offset parameter, the method comprising:
receiving by the digital processor a model for the measurable quantity and a form of a spectral density of the noise process;

approximating a noise spectrum of the noise process by a discrete distribution via the digital processor;

constructing a probability distribution of the noise process based on the discrete distribution via the digital processor, wherein constructing a probability distribution of the noise process includes constructing a probability distribution of the noise process on a next data point based on a probability distribution of the noise process over the frequency space derived from the spectral density of the noise process and a probability distribution of the noise process over time;

evaluating the probability distribution to estimate a noise value via the digital processor;

setting a value of the offset parameter of the at least one of the plurality of devices to an opposite of the estimated noise value via the digital processor; and operating the quantum processor to solve a problem using the value of the offset parameter of the at least one of the plurality of devices.

14. The method of claim 13 wherein evaluating the probability distribution to estimate a noise value includes evaluating the probability distribution by one of:

gradient descent or integration via Markov Chain Monte Carlo, to obtain a noise distribution, fitting the noise distribution to a Gaussian distribution and taking a maxima of the Gaussian distribution as the noise value.

15. The method of claim 13 wherein receiving by the digital processor a model for the measurable quantity comprises determining a model for the measurable quantity via the digital processor.

16. The method of claim 15 wherein determining a model for the measurable quantity includes at least one of:

determining a spin state of a qubit in the quantum processor, the spin state linked to a flux noise and a flux offset parameter; and determining a magnetization of a group of qubits in the quantum processor, the magnetization linked to a flux noise and a flux offset parameter.

17. The method of claim 13 wherein providing a form of a spectral density of the noise process to the digital processor comprises determining a form of a spectral density of the noise process via the digital processor.

18. The method of claim 17 wherein determining a form of a spectral density of the noise process includes at least one of: determining the measurable quantity and computing the form of the spectral density assuming a combination of static error, 1/f spectrum and white noise.

19. A method of operation of a hybrid processor, the hybrid processor comprising a quantum processor and a digital processor, the quantum processor having a plurality of devices, at least one of the plurality of devices having a measurable quantity associated with a noise process and an offset parameter, the method comprising:

receiving by the digital processor a model for the measurable quantity and a form of a spectral density of the noise process;

approximating a noise spectrum of the noise process by a discrete distribution via the digital processor;

constructing a probability distribution of the noise process based on the discrete distribution via the digital processor, wherein constructing a probability distribution of the noise process includes constructing a probability distribution of the noise process on a next data point based on a probability distribution of the noise process over the frequency space derived from the spectral density of the noise process and a probability distribution of the noise process over time;

determining an iterative rule for determining a value of the offset parameter of the at least one of the plurality of devices, the rule depending on a calibration parameter $\alpha$ that at least partially compensates for the noise process, via the digital processor;

evaluating $\alpha$ via the digital processor; and setting $\alpha$ as the value of the offset parameter of the at least one of the plurality of devices via the digital processor; and operating the quantum processor to solve a problem using the value of the offset parameter of the at least one of the plurality of devices.

20. The method of claim 19 wherein evaluating $\alpha$ includes evaluating $\alpha$ as a function of the probability distribution of the noise process and the iterative rule.

21. The method of claim 19 wherein providing a model for the measurable quantity to the digital processor comprises determining a model for the measurable quantity via the digital processor.

22. The method of claim 21 wherein determining a model for the measurable quantity includes one of: determining a spin state of a qubit in the quantum processor, the spin state linked to a flux noise and a flux offset parameter; determining a magnetization of a group of qubits in the quantum processor, the magnetization linked to a flux noise and a flux offset parameter; and determining a magnetization of a group of qubits in the quantum processor, the magnetization linked to a flux noise and a flux offset parameter.

23. The method of claim 19 wherein receiving by the digital processor a form of a spectral density of the noise process comprises determining a form of a spectral density of the noise process via the digital processor.

24. The method of claim 23 wherein determining a form of a spectral density of the noise process includes at least one of: determining the measurable quantity and computing the form of the spectral density assuming a combination of static error, a 1/f spectrum and a white noise.

* * * * *